United States Patent [19]

Booty

[11] 4,114,098
[45] Sep. 12, 1978

[54] MECHANICAL CHANNEL SELECTOR DEVICE

[75] Inventor: Donald J. Booty, Frankfort, Ill.

[73] Assignee: Feldmar Products, Inc., Skokie, Ill.

[21] Appl. No.: 726,479

[22] Filed: Sep. 24, 1976

[51] Int. Cl.² ............................................. H04B 1/06
[52] U.S. Cl. ................................. 325/390; 358/194; 74/10 A
[58] Field of Search .............. 325/390, 389; 74/10 A, 74/142, 141.5, 553, 575, 577 S; 358/194

[56] References Cited

U.S. PATENT DOCUMENTS

| | | | |
|---|---|---|---|
| 1,989,771 | 2/1935 | Reppert | 325/390 |
| 2,170,820 | 8/1939 | Hooven | 325/390 |
| 2,284,683 | 6/1942 | Preussler | 74/10 A |
| 2,853,897 | 9/1958 | Loewy | 74/10 A |
| 3,434,361 | 3/1969 | Blohm | 74/142 |
| 3,572,638 | 3/1971 | Tatsuguchi | 74/142 |
| 3,949,616 | 4/1976 | Cilloniz Oberti | 325/390 |
| 3,962,748 | 6/1976 | Michaels | 325/390 |
| 3,988,680 | 10/1976 | Kolm | 74/10 A |

Primary Examiner—Robert L. Griffin
Assistant Examiner—Tommy P. Chin
Attorney, Agent, or Firm—Emrich, Root, O'Keeffe & Lee

[57] ABSTRACT

A mechanical channel selector device for the remote switching of channels of a television receiver includes a switching mechanism coaxially mounted to the television receiver channel shaft and operatively connected to a manual control mechanism. The switching mechanism includes a switching disc having a series of notches corresponding to the television channels on the inside surface which cooperate with a pawl member pivotally mounted to a switching actuator lever coaxially mounted on the disc and operatively connected to the control mechanism. The control mechanism includes a spring biased control knob movable between an at rest position and an actuated position. Movement of the control knob results in the pivotal movement of the actuator lever and the pawl member engaging a notch on the switching disk to rotate the television receiver channel shaft to the next channel.

8 Claims, 13 Drawing Figures

U.S. Patent  Sept. 12, 1978  Sheet 1 of 2  4,114,098
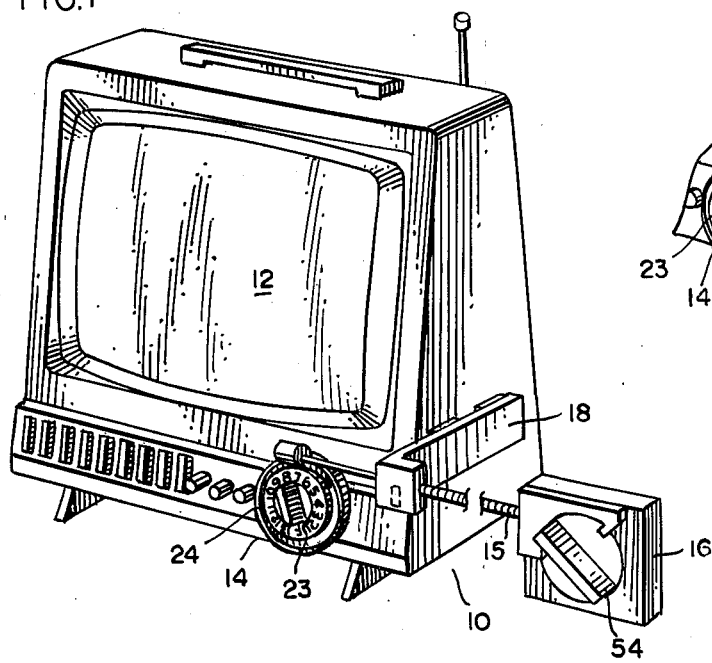
FIG.1
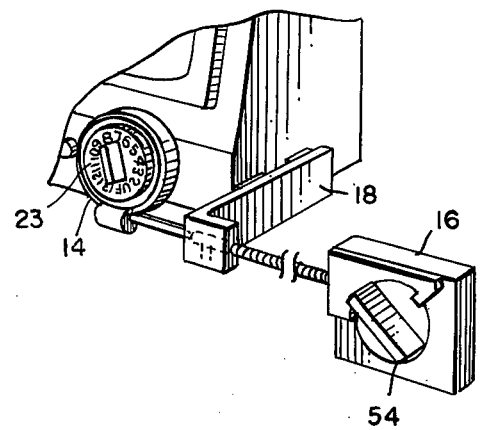
FIG.2
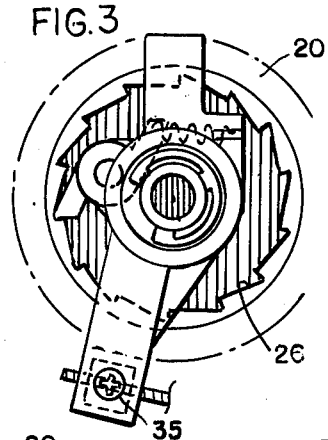
FIG.3
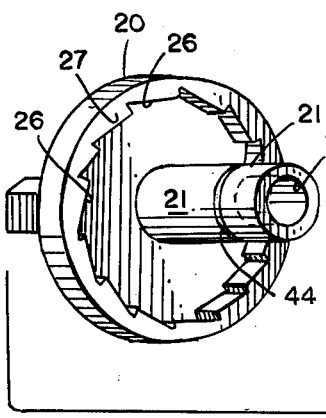
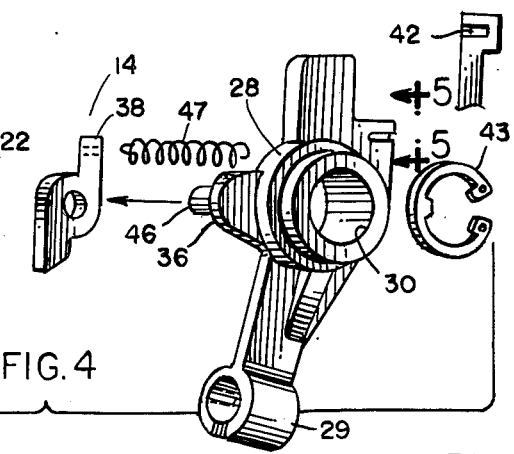
FIG.5
FIG.4
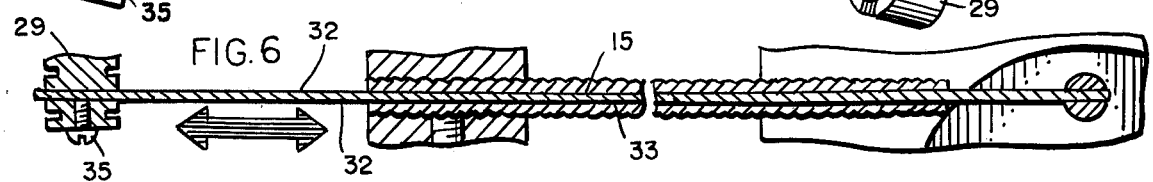
FIG.6
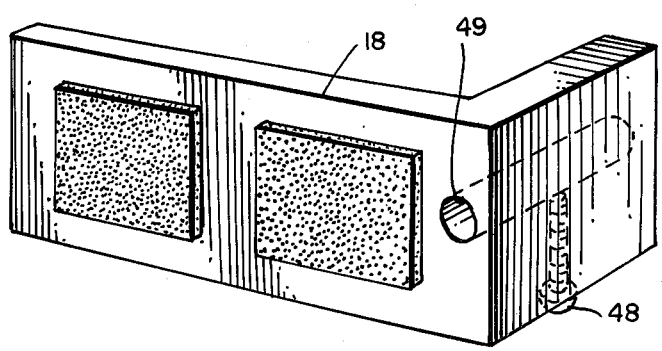
FIG.7

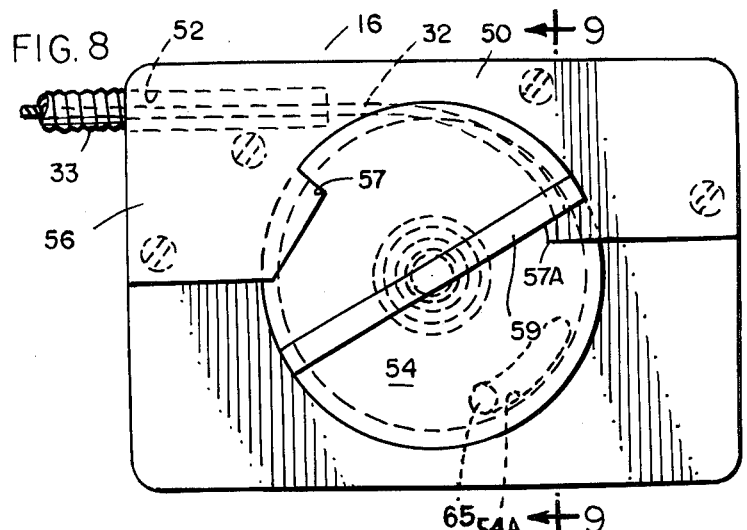
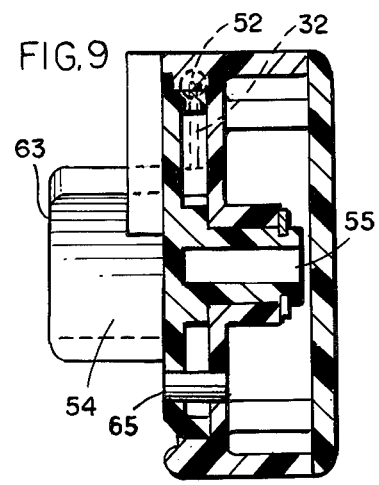
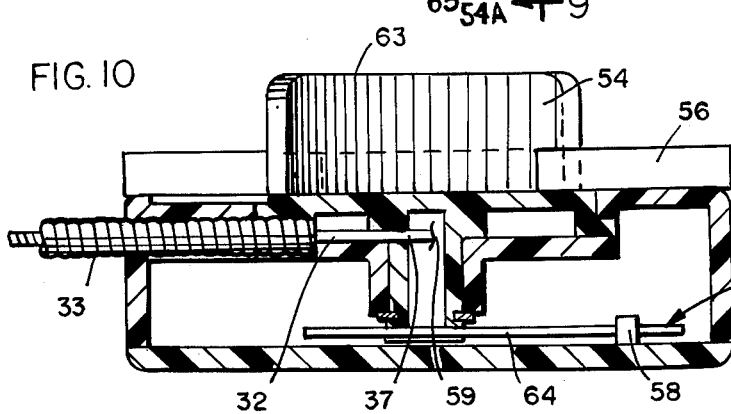
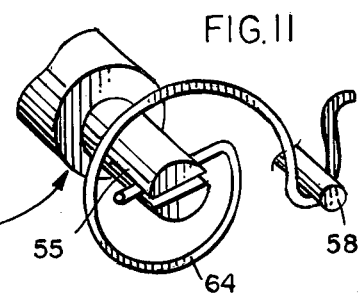
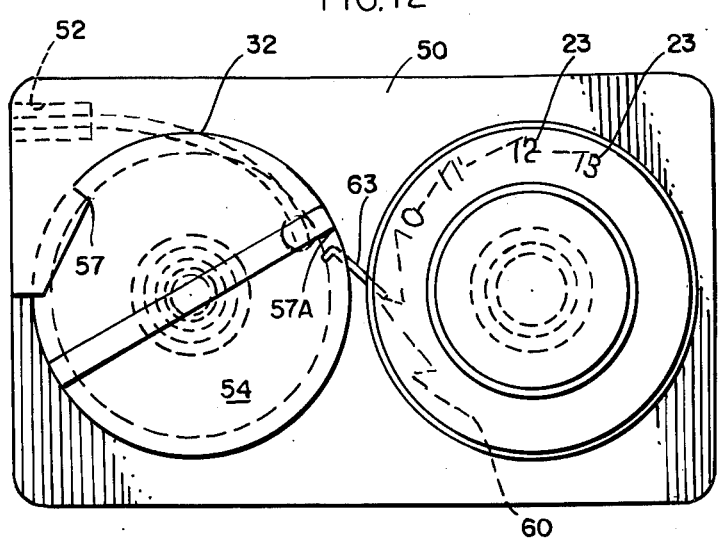
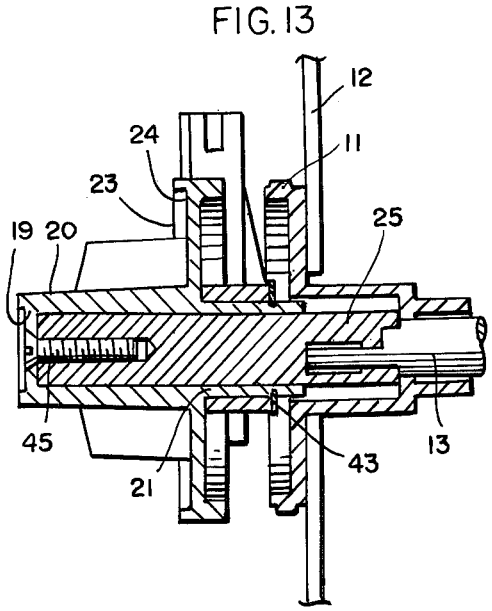

MECHANICAL CHANNEL SELECTOR DEVICE

BACKGROUND OF THE INVENTION

The remote switching of the channels of a television receiver has generally been accomplished by the utilization of electronically controlled remote switching devices which energize electronic signal receiving apparatus located within the television receiver to switch the television receiver channels. Because such complex electronic devices are very expensive and, because they have application on only a small portion of the color television receivers, their widespread use and adoption by the viewing public has been severely limited. Additionally, prior art attempts to design and develop mechanical remote control switching means for manually changing the channels on television receivers have included the mounting of a lever arm to the television receiver and connecting the same by pull cords to a remote station to somehow rotate the channel selector. In such devices, a pully must be permanently attached to the ceiling or other area adjacent the television receiver to permit control over the lever arm. Suffice to say, such devices have not been commercially acceptable by the general viewing public because such mechanical systems are unattractive and unreliable and the television receiver cannot be moved from the viewing area because of the permanence of the pulley attached to the ceiling or the like. Moreover, such devices are not adaptable to be attached to portable television receivers, which comprise a significant number of television receivers viewed by the viewing public.

SUMMARY OF THE INVENTION

It is an object of the present invention to provide an improved mechanical channel selector device having a switching mechanism connected to a manually control mechanism for the remote switching of channels of the television receiver.

It is another object of the present invention to provide an improved mechanical selector device utilizing relatively few parts which is of simple construction and reliable in operation.

It is a further object of the present invention to provide a mechanical channel selector device which includes no electronic devices and requires no electrical power to accomplish the switching of the channels of the television receiver.

It is a further object of the present invention to provide an improved remote manual control mechanism for the switching of the channels of the television receiver.

In a preferred embodiment of the present invention, the mechanical channel selector device includes a switching mechanism coaxially mounted to the television receiver channel shaft and operatively connected by a cable element to a remote control mechanism. The switching mechanism includes a switching disc having channel indicia thereon and having a plurality of notches positioned on the inside surface thereof which cooperate with a pawl pivotally mounted to a switching lever coaxially mounted on the switching disc. The switching disc is mounted onto a spline member which is adapted to engage the television receiver channel shaft. The switching lever is connected by a cable element to a control mechanism. The control mechansim includes a control knob pivotally mounted in the control housing and movable from a first unactuated rest position to a second position actuated position. Pivotal movement of the control knob from the first to the second position causes the cable element to partially rotate the switching lever. The partial rotation of the switching lever causes the pawl, engaged in the notches in the inside surface of the switching disc, to rotate the disc and the attendent spline member and the channel shaft to the next channel. Return of the control knob to the first position returns the switching lever and the pawl member to their original position for the next channel switching operation.

In a further embodiment of the present invention, the mechanical channel selector device includes a switching mechanism which is identical with that set forth above except that it has no channel indicia thereon. In this embodiment, the control mechanism includes a control knob mounted in the control housing and movable from an at rest position to an actuated position, as set forth above. Additionally, the control knob includes a pawl lever mounted thereon and moveable therewith which is engageable with a ratchet wheel rotatably mounted to the control housing adjacent the control knob. The ratchet wheel includes indicia thereon which corresponds to the channels on the television receiver. The rotation of the control knob from the first to the second position results in the pawl engaging the ratchet wheel to rotate the same to indicate the selected channel while the switching mechanism rotates the television receiver channel shaft, as set forth in the first embodiment. Thus, the remote control mechanism indicates to the viewer the channels, as he is switching the channels.

BRIEF DESCRIPTION OF THE DRAWINGS

FIG. 1 is a perspective view of a television receiver utilizing the mechanical channel selector device for clockwise rotation of the television receiver channel shaft in accordance with the present invention;

FIG. 2 is an enlarged partial perspective view showing mounting of the switching mechanism in accordance with the present invention for counter-clockwise rotation of the television receiver channel shaft;

FIG. 3 is an end view of the switching mechanism portion of the mechanical channel selector device in accordance with the present invention;

FIG. 4 is an exploded perspective view showing the switching mechanism portion in accordance with the present invention;

FIG. 5 is a cross-sectional view taken along lines 5—5 of FIG. 4;

FIG. 6 is an enlarged perspective view showing the operative connection of the switching mechanism portion with the control mechanism portion in accordance with the present invention;

FIG. 7 is an enlarged perspective view showing the attachment member for mounting the connecting cable to the television receiver in accordance with the present invention;

FIG. 8 is a top elevation view of the control mechanism portion of the mechanical selector device in accordance with the present invention;

FIG. 9 is a cross-sectional view taken along lines 9—9 of FIG. 8;

FIG. 10 is a side cross-sectional view of the control mechanism of the mechanical selector device in accordance with the present invention;

FIG. 11 is an exploded partial perspective view showing the spring biased return portion of the control mechanism in accordance with the present invention;

FIG. 12 is an exploded perspective view of a further embodiment of the mechanical channel selector device in accordance with the present invention; and FIG. 13 is a cross-sectional view showing the mounting of the switching mechanism to the television receiver in accordance with the present invention.

DETAILED DESCRIPTION

Referring now to the drawings in greater detail, wherein like numbers have been used throughout the several views to designate the same or similar parts, there is illustrated and shown in FIG. 1 a perspective view of the mechanical channel selector device 10 attached to a television receiver 12 in accordance with the present invention. The mechanical channel selector device 10 includes a switching mechanism portion 14 which is coaxially mounted to the television receiver channel shaft (not shown) and operatively connected by cable element or member 15 to the remote control mechanism portion 16 which is located in a position remote from the television receiver 12. A bracket member 18 is preferably mounted to the side of the television receiver 12 to hold and retain the cable element 15 in alignment with the switching mechanism portion 14, as will hereinafter be described.

Referring now to FIGS. 3, 4 and 13, there is illustrated the components of the switching mechanism portion 14 according to the present invention. The switching mechanism means 14 includes a switching disc member 20 integrally mounted to a switching disk shaft 21 which has a bore 22 therein which is adapted to fit onto a spline member 25 (FIG. 13) which is adapted to engage the television receiver channel shaft 13. The switching disc member 20 includes a plurality of indicia 23 (FIG. 1) on the front face 24 (FIG. 13) thereof, which indicia 23 indicate the television channel to which the television receiver 12 is tuned. One end of disc member 20 includes an opening 19 therein which cooperates with fastening means 45 to mount the disc member 20 to the spline member 25. The circular switching disc member 20 includes also a plurality of notches or recesses 26 (FIG. 3) integrally formed on the inside surface 27 thereof which cooperate with a pawl lever 38 to selectively rotate the television receiver channel shaft 13 a predetermined number of degrees of rotation to switch and change the channels on the television set, as will hereinafter be described.

A control lever 28 having an opening 30 therein, which opening is adapted to fit over the switching shaft 21 to permit the lever 28 to freely rotate thereon, includes an end bracket portion 29 which is adapted to receive and hold one end of the control cable 32 of cable element 15. The end bracket portion 29 includes fastening means 35 (FIGS. 3 and 6) which is adapted to firmly engage and retain the end of cable 32. Although shown as including a screw member 35 being engageable with cable 32 to hold the same firmly to the end portion 29, it is within the scope of the present invention to include any means for anchoring the cable to the end portion of lever 28. The control lever 28 further includes a projection portion 36 thereon, which projection 36 includes a post member 46 adapted to receive a pawl member 38 thereon. The pawl member 38 is spring biased by spring member 47, anchored to another projection member 42 (FIG. 5) extending outwardly from control lever 28 such that the pawl member is held in engagement with recesses 26. Thus, upon the partial pivotal movement of the control lever 28, the pawl member 28 engages recesses 26 to rotate the switching disc 20 and the television receiver shaft 13 to the next channel, as will hereinafter be described. Retaining ring 43 is adapted to fit into groove 44 extending around the switching shaft 21 to operatively hold the control lever 28 onto the shaft 21 (See FIG. 13).

Preferably, the cable 32 of cable element 15 is of a metal construction and is of sufficient strength to permit thousands of repeated operations of the present invention. The cable element 15 includes a sleeve member 33 extending the length of the cable 32. The fastening means 35 on end bracket portion 29 firmly engages the cable 32 to anchor the same to the control lever 28. As shown in FIG. 7, bracket member 18, having fastening means 48 thereon, is positioned on the side on the teleivison receiver 12. The bracket member 18 includes an opening 48 therein through which the cable 32 and sleeve member 33 are inserted to align and hold the same in operating relation with respect to the switching mechanism 14. The bracket member 18 includes fastening means 48 which engages the sleeve member 33 of the cable 32 to firmly retain and hold the sleeve while permitting the movement of the cable 32 within the sleeve member, as desired.

The control mechanism 16 includes a housing 50 (FIGS. 8, 9 and 10) having an opening therein 52 through which the cable 32 and sleeve 33 are inserted. The end 37 of cable 32 is attached to a control knob 54 by anchoring means 59. The control knob 54, mounted to the control housing 50, pivotally mounted within the housing reciprocally moves between an at rest postiion and an actuated position. The end of shaft 55 of the control knob 54 is attached to a retaining spring 57, which is anchored to post 58 within the control housing 50 (FIG. 10). Preferably, the housing 50 includes a plate member 56 which is attached to the housing 50. The plate member 56 includes a pair of projections 57 and 57A thereon which confine the rotation of the control knob 54 within a predetermined degree of rotation. Projections 57 and 57A are engaged by control knob handle element 63 to confine the pivotal movement of the knob 54 between an at rest and an actuated position. The control knob shaft 55 includes anchoring means 59 wherein the end 37 of Cable 32 (FIG. 10) may be attached thereto.

As shown in FIG. 8, the plate member 56 includes a pair of projections 57 and 57A thereon which confine the rotation of the control knob within a predetermined degree of rotation. However, it is within the spirit of the present invention to include a control knob 54 having an elongated opening 54A therein, the ends of which are selectively engageable with a post member 65 mounting to the control housing 50 (FIG. 8) to confine the pivotal movement of the knob 54 between an at rest and an actuated position.

To understand the operation of the mechanical channel selector device 10, the television channel selector knob (not shown) is removed from the television receiver 12. The spline member 25 is inserted onto the television receiver shaft 13 (FIG. 13) and the switching disc 20 is attached by fastening means 45 to the spline member 25. When the switching disc is positioned onto the spline member 25, the fine tuner element 11 (FIG. 13) is operable and not obstructed from use by the viewer. The bracket member 18 is attached to the receiver 12, as shown in FIG. 1, and the cable 32 is attached by fastening means 35 to the end bracket portion 29 of the control lever 28, with the other end 37 of cable being attached by anchoring means 59 to control knob 54.

To operate the mechanical selector device 10, the control knob 54 is rotated from the at rest position, wherein the control knob 54 is in engagement with plate member 56 projection 57, towards plate member projection 57A in a clockwise fashion. Such pivotal movement causes the cable 32 to move which in turn rotates the end bracket 29 of the control lever 28 in a clockwise fashion. Because of pawl member 38, mounted to the control lever 28, is engaged in notch 26, the movement of pawl member 38 causes the switching disc 20 to be rotated in a clockwise fashion. Such movement results in the spline member 25 rotating the television receiver channel shaft 13 in a clockwise fashion to change and index the channel to the next channel. The full pivotal movement of the control knob 54 from projection 57 to 57A pivotally rotates the control lever 28 to index the television receiver shaft 13 two channels at a time. It is possible because of the detent action of the receiver channel selector to control movement of the control knob 54 such that only one channel is indexed, as desired. When the control knob 54 engages housing projection 57A, it is pivotally returned by spring 64 to engage projection 57, in the at rest position. During the return of the knob 54 to the at rest position, the cable 32 is returned to its original position thereby rotating the control lever back two channels wherein the pawl member 38 engages a predetermined notch 26 in the switching disc 20 to prepare the channel selector device 10 for the next channel selection.

A further embodiment of the present invention is shown in FIG. 12 and includes a switching mechanism 14 which is substantially identical as the embodiment shown in FIGS. 1 and 2. However, the front surface 24 of the switching disc 20 does not include indicia 23 thereon. Instead, the control housing 50 includes a ratchet gear 60, mounted therein adjacent control knob 54, which includes indicia 23 thereon. The control knob 54 includes a pawl member 62 attached thereto which is selectively engageable with the ratchet gear 60, such that upon the rotation of the control knob 54 from the first to the second position, the pawl member 62 engages the ratchet gear to index the same and properly align the indicia 23 thereon. Such an embodiment provides indicia on the control mechanism 16 to indicate to the user thereof the proper channel to which the channel selector is tuned. Thus, when the mechanical channel selector device 10 is remotely located away from the television receiver 12, it is possible for the user to precisely determine the proper channel to which he is desirous of selecting without having to determine the channel from the switching disc 20 mounted upon the television receiver 12.

FIG. 2 shows a further modification of the present invention wherein the switching mechanism 14 may be designed wherein the control lever 28 extends downwardly from the switching shaft 21 and the movement of the control mechanism 16 results in a counterclockwise rotation of the switching mechanism 14. In such an embodiment the notches 26 on the inside surface of the switching disc 20 (not shown) are positioned in opposite directions as those shown in FIGS. 3 and 4 to result in a counterclockwise rotation of the receiver channel shaft 13. In such an embodiment the bracket member 18 is mounted on the television receiver 12 in a position (FIG. 2) lower than shown in FIG. 1 so that the cable 32 is aligned with end bracket 29 of the control lever 28 to provide the counterclockwise switch action of the television selector channel device 10.

If it is desired to remove the mechanical channel selector device 10 from the television receiver 12, all that is necessary is to loosen the fastening means 35 on the end bracket 29 of the control lever and the fastening means 48 on the bracket member 18 thereby freeing the cable 32 for removal from the receiver 12. Then the fastening means 45 may be loosed and the entire switching disc 20 and spline 25 may be removed from the receiver shaft 13. The original television receiver channel selector knob is then repositioned on the receiver channel shaft to return the television receiver to its original condition.

In accordance with the foregoing disclosure, the mechanical channel selector device of the present invention eliminates the need for complex electronic and electrical devices to accomplish the remote control switching of television receiver channels. Moreover, the force required to manually rotate the mechanical channel selector device of the present invention is comparable to that required to manually rotate the standard channel selector knob on the existing television receivers. Additionally, the unique switching mechanism of the present invention enables the user thereof to utilize the detent action of the television channel selection tuner to provide precise selection of the desired channel.

I claim:

1. A mechanical channel selector device for the remote switching of channels of a television receiver having a housing and a receiver channel shaft, including in combination:

switching means coaxially and adjustably mounted to the television channel receiver shaft;

bracket means mounted to the television receiver housing adjacent said switching means;

cable connector means slidably mounted to the television receiver housing by said bracket means and attached to said switching means, said cable connector means including a cable member positioned within a sleeve member, said sleeve member adapted to be engaged by said bracket means to fixedly anchor said sleeve member, with said bracket means providing alignment of said connector means with said switching means to permit the axial movement of said cable member therein; and control means operatively connected by said cable connector means to said switching means said control means being rotatable between a first at rest position to a second actuated position, said rotational movement of said control means from said first to said second position causing said cable member to axially move therewith and rotate said switching means and the television receiver channel shaft to the next television receiver channel to predeterminely index the same.

2. The mechanical channel selector device in accordance with claim 1 further including spring bias means engageable with said control means to return the same from said second actuated position to said first at rest position.

3. The mechanical channel selector device in accordance with claim 1 wherein said switching means includes a spline member adapted to engage and rotate the receiver channel shaft and a switching disc portion mounted on said spline member and rotatable therewith, with said switching disc portion being attached to said cable connector means and being rotatable by the movement of said cable connector means to index the receiver channel shaft to the next channel.

4. The mechanical channel selector device in accordance with claim 3 wherein said switching disc portion includes a disc member having a plurality of recesses positioned on the inside surface thereof and a control lever coaxially mounted to said disc member and attached to said connector means and including a pawl member which selectively engages said recesses positioned on said disc member, such that upon movement of said cable connector means said pawl member engages said recesses to rotate said member and said spline member to index the receiver channel shaft to the next channel.

5. The mechanical channel selector device in accordance with claim 1 wherein said control means includes a housing having a control knob pivotally mounted therein and operatively connected to said connector means.

6. The mechanical channel selector device in accordance with claim 1 wherein said switching means includes indicia thereon which indicate the channel to which the television receiver is tuned.

7. The mechanical channel selector device in accordance with claim 5 wherein said housing further includes a ratchet gear having indicia thereon mounted adjacent said control knob and said control knob includes a pawl member mounted thereon and engageable with said ratchet gear, such that upon said pivotal movement of said control knob from said first to said second position, said pawl lever engages said ratchet gear to rotate the same to indicate the channel to which the television receiver is tuned.

8. The mechanical channel selector device in accordance with claim 1 wherein said control means includes indicia thereon which indicate the channel to which the television receiver is tuned.

* * * * *